United States Patent [19]

Huang et al.

[11] 3,895,429

[45] July 22, 1975

[54] METHOD OF MAKING A SEMICONDUCTOR DEVICE

[75] Inventors: Ho-Chung Huang, Hightstown; Angela San-Paolo, Trenton, both of N.J.

[73] Assignee: RCA Corporation, New York, N.Y.

[22] Filed: May 9, 1974

[21] Appl. No.: 468,594

[52] U.S. Cl. ........................ 29/580; 29/583; 29/591

[51] Int. Cl. ........................ B01j 17/00

[58] Field of Search ........................ 29/580, 583, 591

[56] References Cited

UNITED STATES PATENTS

| | | | |
|---|---|---|---|
| 3,432,919 | 3/1969 | Rosvold | 29/580 |
| 3,453,722 | 7/1969 | Ramsey | 29/580 |
| 3,559,283 | 2/1971 | Kravitz | 29/580 |
| 3,579,815 | 5/1971 | Gentry | 29/580 |
| 3,670,404 | 6/1972 | Kamoshida | 29/580 |

*Primary Examiner*—W. Tupman

*Attorney, Agent, or Firm*—Glenn H. Bruestle; Donald S. Cohen; Carl L. Silverman

[57] ABSTRACT

A conducting layer having a plurality of spaced openings is provided on a surface of a semiconductor wafer. Grooves are formed on the semiconductor wafer from an opposing surface of the semiconductor wafer so that each one of the remaining portions of the semiconductor wafer is disposed across one of the openings. Removable filling material is inserted into the grooves in the semiconductor wafer. A substrate layer is provided in electrical contact with a surface of each one of the remaining portions of the semiconductor wafer. The remaining portions of the semiconductor wafer are separated from each other.

5 Claims, 7 Drawing Figures

METHOD OF MAKING A SEMICONDUCTOR DEVICE

BACKGROUND OF THE INVENTION

The invention herein described was made in the course of or under a contract or subcontract thereunder with the Department of the Navy.

The present invention relates to a method of making a semiconductor device, and particularly to a method suitable for mass producing such devices.

Electron beam semiconductor devices have been developed which have properties of both vacuum tubes and semiconductors while providing capabilities found in neither. In an electron beam semiconductor device, a radio frequency signal can be amplified by using the signal to control a high voltage electron beam which bombards a solid state target, e.g., a semiconductor diode target, with the target producing an output signal.

The underlying principle of the electron beam semiconductor amplifier is the current multiplication in a reverse biased semiconductor element, such as a PN junction or a Schottky-barrier diode, when bombarded by a high velocity electron beam. If the velocity of the electrons is sufficiently high, e.g., 5 to 20 Kev, the beam will penetrate the semiconductor material of the target and its energy will be dissipated in the creation of electron-hole pairs. For example, in silicon, the energy required for creation of an electron-hole pair is approximately 3.6 Ev so that a primary electron having an energy of 10 Kev will create approximately 2,800 electron-hole pairs if the penetration losses are neglected. Therefore, under the proper reverse bias, the current gain would also be 2800.

The most critical and important element in the operation of an electron beam semiconductor amplifier is the semiconductor target. For satisfactory performance, such a target must provide a high current gain and a high breakdown voltage. A servere requirement imposed on the semiconductor target is the maintenance of high current gains and breakdown voltages in the environment of the vacuum tube and electron beam. The vacuum exhaust procedures, such as the high temperature required for the bake out and cathode activation, e.g., approximately 450°C, and the subsequent bombardment by the high voltage electron beam may cause metallurgical changes on the surface, periphery, and possible the bulk of the semiconductor target.

It is therefore apparent that the fabrication of the semiconductor target may inherently degrade the current gain and voltage breakdown characteristics of the device as well as decrease the radio frequency performance. Degradation of these characteristics may also occur with operating time. It would therefore be desirable to develop a method of making semiconductor devices useful as targets for electron beam semiconductor devices with such a method capable of mass producing targets which meet the stringent requirements for successful operation.

SUMMARY OF THE INVENTION

A first conducting layer is provided on one of a pair of opposed surfaces of a semiconductor wafer. A second conducting layer having a plurality of spaced openings is formed on the first conducting layer. Grooves are formed in the semiconductor wafer from the other surface of the semiconductor wafer along lines extending between the openings in the second conducting layer. The grooves are formed in such a way that each one of the remaining portions of the semiconductor wafer is disposed across one of the openings. Removable filling material is inserted into the grooves in the semiconductor wafer. A substrate layer is provided in electrical contact with a surface of each one of the remaining portions of the semiconductor wafer. The remaining portions of the semiconductor wafer are separated.

DETAILED DESCRIPTION

Figure 1:
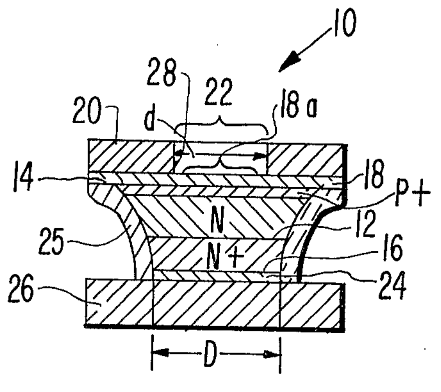
FIG. 1 is a cross-sectional view of one form of a semiconductor device made through the method of the present invention.

Referring initially to FIG. 1, one form of a semiconductor device made through the method of the present invention is generally designated as 10. The semiconductor device 10 comprises a body 12 of a semiconductor material such as silicon, having a pair of opposing surfaces 14 and 16. For purposes of description, the surface 14 is designated as the top surface 14 and the surface 16 is designated as the bottom surface 16; it being understood that top and bottom are actually dependent upon the orientation of the semiconductor device 10. The semiconductor body 12 includes regions of different conductivity type, e.g., as shown in FIG. 1, at P+, an N and an N+ region. The semiconductor body 12 is shown in the form of an inverted mesa with its top surface 14 being greater in area than its bottom surface 16. A conducting layer 18, e.g., 400A of chromium, is on the top surface 14 of the semiconductor body 12 and extends beyond the top surface 14. An electron beam shield 20 capable of protecting the periphery of the semiconductor body 12 from damage caused by high voltage electrons, such as a gold ring approximately 3 mils thick, is on the conducting layer 18. The electron beam shield 20 has an opening 22 therein which exposes a contact portion 18*a* of the conducting layer 18 having a diameter *d*, as shown in FIG. 1. Thus, the electron beam shield 20 also functions as an electrical connection for the semiconductor device 10 as well as a convenient means of handling the device 10 without causing damage to the semiconductor body 12. As shown in FIG. 1, the top surface 14 of the semiconductor body 12 is disposed across the opening 22. For structural strength, it is preferable that the opening 22 be smaller in area than both the top surface 14 and the bottom surface 16 of the semiconductor body 12. For example, as in FIG. 1, diameter *d* is slightly smaller than the dimension D of the semiconductor device.

It is preferable that a conducting layer 24 such as a thin layer of chromium, e.g., 400A, covered by a layer of gold, e.g., 4,000A, be provided on the bottom surface 16 of the semiconductor body 12 since the chromium gold layer will make it easier to later plate a substrate layer on the bottom surface 16. A passivation layer 25 of a material capable of protecting the semiconductor body 12 from its fabrication and operating environment, such as aluminum oxide or silicon dioxide, is provided on the outer edges of the semiconductor body 12, i.e., the surfaces not otherwise protected from the environment. The passivation layer 25 is of a suitable thickness, e.g., 6,000A for aluminum oxide. A substrate layer 26, of a material having good electrical and thermal conductivity, such as gold, is in electrical contact with the conducting layer 24.

Although the semiconductor body 12 is shown in the form of an inverted mesa for structural strength, the method of the present invention is equally successful in making a device with a semiconductor body 12 having a different shape, e.g., rectangular solid, cube, etc., as long as the semiconductor device maintained some degree of structural support. Furthermore, although the opening 22 is described as being circular in shape, the opening 22 can be of any shape desired, e.g., a square shape.

Figure 2:
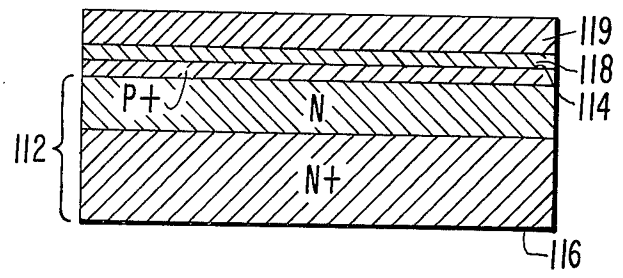
FIGS. 2, 3, 4, 5, 6 and 7 are sectional views showing the steps of making the semiconductor device of FIG. 1 through the method of the present invention.

In the method of the present invention, a semiconductor wafer 112 is first formed with a pair of opposing surfaces 114 and 116 as shown in FIG. 2. The semiconductor wafer 112 can be formed by methods well known in the art, e.g., growing epitaxial layers and doping the epitaxial layers with an appropriate conductivity modifier. The top surface 114 of the semiconductor body 112 is provided with a conducting layer 118, e.g., 400A of chromium or any other metal having a light mass and high electrical conductivity. The conducting layer 118 can be deposited through any well known method, such as evaporation in a vacuum, sputtering, or chemical plating. Next, a conducting layer 119, e.g., about 4,000A of gold, is formed on the conducting layer 118 through any well known method. The conducting layer 119 functions as a base which later forms a portion of the electron beam shield 20 of FIG. 1.

Figure 3:
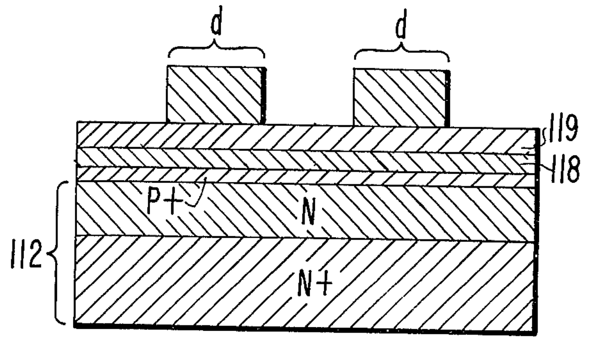

Next, photolithographic deposition techniques can be employed to form a conducting layer 120, e.g., of gold, of about 3 mils in thickness having openings 122 with a diameter *d* substantially the same as the diameter *d* of the semiconductor device 10 of FIG. 1. Photoresist is applied on the surface of the conducting layer 119 and then exposed so as to leave photoresist remaining in those areas where the openings 122 are to be formed as in FIG. 3. In order to form openings 122 having edge surfaces 128 which are substantially straight and parallel as in FIG. 4 it is preferable to employ a thick photoresist such as Laminar photoresist which is commercially available from Dynachem Corporation. The deposition of the conducting layer 120 may be done through any conventional method, such as chemical plating.

Figure 4:
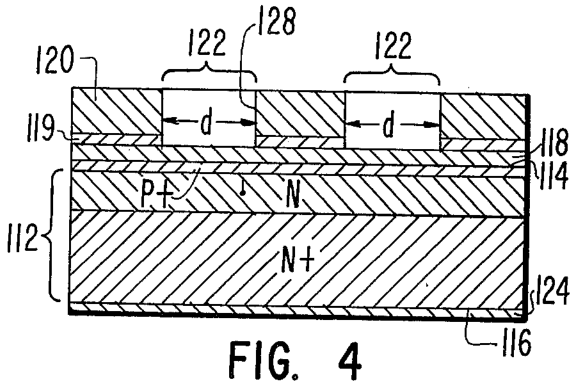

The gold remaining on the portion of conducting layer 118 which is exposed by the opening 122 is removed through treating the surface with a solvent such as a standard gold etch so as to form a structure substantially similar to the one shown in FIG. 4. At this point, the remaining portions of conducting layer 119 have become an undivided part of conducting layer 120 so that for purposes of description conducting layer 120 now includes the remaining portions of conducting layer 119 as in FIG. 5. For some applications, the conducting layer 120 may be formed by depositing a conducting layer and then etching the openings in the conducting layer as is well known in the art. A conducting layer 124 is then deposited on the bottom surface 116 of the semiconductor wafer 112 as shown in FIG. 4 in the same manner as previously described for the conducting layer 118. It is preferable that the conducting layer 124 comprise a double layer of the same material as the conducting layer 24 of the semiconductor device 12 of FIG. 1.

Figures 5, 6:
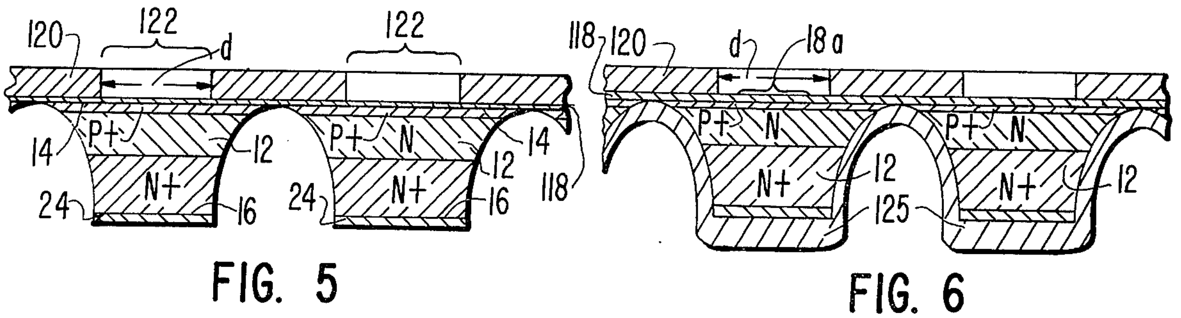

Next, grooves are formed in the semiconductor wafer 112 from the conducting layer 124 and the bottom surface 116 along lines extending between the openings 122. The grooves are formed in such a way that each one of the remaining portions of the semiconductor wafer 112 is disposed across one of the openings 122. The remaining structure is substantially the same as the one described in FIG. 5 with each one of the remaining portions 12 of the semiconductor wafer 112 in the shape of an inverted mesa having a pair of opposing surfaces 14 and 16. The top surface 14 of each one of the remaining portions 12 is disposed across a separate one of the openings 122. Standard etching techniques can be utilized to form the grooves in the semiconductor wafer 112 so as to form the structure of FIG. 5. For example, well known etching techniques permit etching first the conducting layer 124 of FIG. 4, then the semiconductor wafer 112 in such a manner as to reach the conducting layer 118 with the etching going horizontally as well as vertically, for structural support, as shown in FIG. 5. The gold layer of the conducting layer 124 can be etched away using a gold etchant such as aqua regia or any other gold etchant such as one which is commercially available as C-35 from Film Microelectronics, Inc. The chromium layer of the conducting layer 124 can be etched using a standard chromium etchant such as C-25A with C-25B, also commercially available from Film Microelectronics, Inc. The silicon semiconductor wafer 112 can be etched using a silicon etchant such as hydrofluoric acid and nitric acid, commercially available from Mallinckrodt Chemical Works.

The outer edges of each one of the remaining portions 12 of FIG. 5 may then, if desired, be provided with a passivation layer 125 as shown in FIG. 6. The passivation layer 125 can be deposited by electron beam evaporation or by sputtering and should be of a suitable thickness, e.g., 3,000A to 6,000A for aluminum oxide. The former technique having been described in "The Journal of Vacuum Science Technology," Vol. 8, No. 1, January/February 1971 by Hoffman and Leibowitz in an article entitled, "$Al_2O_3$ Films Prepared by Electron-Beam Evaporation of Hot Pressed $Al_2O_3$ in Oxygen Ambient." After the application of the passivation layer 125, the structure is substantially similar to the one described in FIG. 6.

Figure 7:
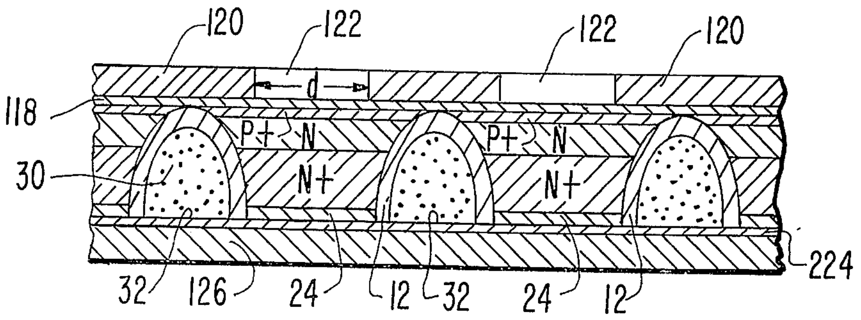

A removable filling material 30 is then inserted into the spaces created by forming the grooves in the semiconductor wafer 112, as shown in FIG. 7. The filling material 30 can be of any well known material capable of providing an adhering base for a substrate layer and capable of being easily removed, such as the photoresist commercially available as Shipley AZ-111B, from Shipley Co., Inc. The filling material 30 is then lapped so as to form a surface 32 of the filling material 30 which is substantially coplanar with the conducting layer 24, e.g., lapping with 4,000 grade sandpaper. A substrate layer 126 having good electrical and thermal conductivity such as a 3 mil layer of gold, is then provided, e.g., electroplated, on the conducting layer 24 as in FIG. 7. It may be preferable to deposit, e.g., evaporation in a vacuum, a conducting layer 224 on the conducting layer 24 prior to providing the substrate layer 126 so as to provide an adhering base for the substrate layer 126 as shown in FIG. 7. The remaining portions 12 of the semiconductor wafer 112 are then separated by cutting along lines extending between the openings 122 through any conventional means, e.g., the use of a wire saw station, such as one having a tungsten wire for cutting. If desired, the removable filling material 30 is then removed, e.g., treated with a solvent, such as acetone for photoresist, so as to form a plurality of semiconductor devices 10 substantially similar to the one described in FIG. 1.

Although the method of the present invention has been illustrated having a conventional silicone diode target as the semiconductor device, the method is also applicable for forming semiconductor targets of different materials, e.g., gallium arsenide and gallium arsenide phosphide. In addition, the method of the present invention can be utilized to form a semiconductor target having a Schottky-barrier diode. Furthermore, the method of the present invention is also applicable for forming other forms of semiconductor devices in which mass production is an important consideration. Thus, the method of the present invention provides a means of mass producing semiconductor devices useful as targets for electron beam semiconductor devices with the targets meeting the stringent requirements for successful operation.

We claim:

1. A method of making a semiconductor device comprising the steps of:

a. providing a first conducting layer on one of a pair of opposed surfaces of a semiconductor wafer, then
b. forming on said first conducting layer a second conducting layer having a plurality of spaced openings, then
c. forming grooves in said semiconductor wafer along lines extending between said openings from the other of said surfaces of said semiconductor wafer so that each one of the remaining portions of said semiconductor wafer is disposed across one of said openings, then
d. inserting a removable filling material into said grooves in said semiconductor wafer, then
e. providing a substrate layer in electrical contact with a surface of each one of said remaining portions of said semiconductor wafer, and then
f. separating said remaining portions of said semiconductor wafer.

2. A method in accordance with claim 1 in which prior to forming said grooves in said semiconductor wafer, a conducting layer is provided on the other of said opposed surfaces of said wafer.

3. A method in accordance with claim 2 in which said grooves in said semiconductor wafer are formed by etching through said conducting layer on said other surface of said wafer and into said wafer.

4. A method in accordance with claim 3 in which prior to providing said substrate layer, said filling material is lapped so as to have a surface which is substantially coplanar with said conducting layer on said other surface of said wafer.

5. A method in accordance with claim 1 in which after forming said grooves and before inserting said filling material in said grooves, a passivation layer is provided on the outer edges of each one of said remaining portions.

* * * * *